(12) United States Patent
Aoki et al.

(10) Patent No.: US 11,079,183 B2
(45) Date of Patent: Aug. 3, 2021

(54) VAPOR CHAMBER

(71) Applicant: FURUKAWA ELECTRIC CO., LTD., Tokyo (JP)

(72) Inventors: Hirofumi Aoki, Tokyo (JP); Yoshikatsu Inagaki, Tokyo (JP); Hiroshi Sakai, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 76 days.

(21) Appl. No.: 16/521,487

(22) Filed: Jul. 24, 2019

(65) Prior Publication Data

US 2019/0360762 A1 Nov. 28, 2019

Related U.S. Application Data

(63) Continuation of application No. PCT/JP2018/002406, filed on Jan. 26, 2018.

(30) Foreign Application Priority Data

Jan. 27, 2017 (JP) .............................. JP2017-013588
Feb. 3, 2017 (JP) .............................. JP2017-018857

(51) Int. Cl.
*F28D 15/00* (2006.01)
*F28D 15/04* (2006.01)

(52) U.S. Cl.
CPC .................................. *F28D 15/04* (2013.01)

(58) Field of Classification Search
CPC .. F28D 15/0233; F28D 15/0283; F28D 15/04; F28D 15/02; F28D 15/00; F28F 21/08; F28F 3/08; F28F 2275/06; F28F 3/12; H01L 23/427; H01L 23/445; H01L 33/648; H05K 7/20336
USPC .......................................... 165/80.4, 104.21
See application file for complete search history.

(56) References Cited

U.S. PATENT DOCUMENTS

2007/0012431 A1  1/2007  Miyahara
2009/0020274 A1  1/2009  Kawabata
2010/0251547 A1  10/2010  Yajima et al.
(Continued)

FOREIGN PATENT DOCUMENTS

JP   H10082591 A   3/1998
JP   2000258079    9/2000
(Continued)

OTHER PUBLICATIONS

English Translation of Notification of Reasons for refusal dated Aug. 21, 2017 received in Japanese Application No. 2017-013588.
(Continued)

*Primary Examiner* — Henry T Crenshaw
*Assistant Examiner* — Kamran Tavakoldavani
(74) *Attorney, Agent, or Firm* — Dorsey & Whitney LLP

(57) ABSTRACT

A vapor chamber excellent in productivity, reduction of a number of components, and capable of preventing reduction in area of a cavity section while reducing a space of an outer periphery of the cavity section in which a working fluid is sealed is provided. An example vapor chamber has a container in which a cavity section is formed by stacked plate-shaped members, a working fluid that is sealed in the cavity section, and a wick structure accommodated in the cavity section.

18 Claims, 10 Drawing Sheets

(56) References Cited

U.S. PATENT DOCUMENTS

| | | | | |
|---|---|---|---|---|
| 2010/0307722 A1* | 12/2010 | Ryoson | ............... | F28D 15/0233 |
| | | | | 165/104.26 |
| 2012/0285662 A1* | 11/2012 | Meyer, IV | .............. | F28D 15/04 |
| | | | | 165/104.26 |
| 2016/0003553 A1* | 1/2016 | Campbell | ........... | H01M 10/613 |
| | | | | 165/166 |
| 2018/0372412 A1* | 12/2018 | Jedraszak | ............... | F28F 3/027 |

FOREIGN PATENT DOCUMENTS

| | | | | |
|---|---|---|---|---|
| JP | 2005016892 | | | 1/2005 |
| JP | 2006153438 | | | 6/2006 |
| JP | 2006153438 | A | * | 6/2006 |
| JP | 2007-093020 | A | | 4/2007 |
| JP | 2009024933 | | | 2/2009 |
| JP | 2010243077 | | | 10/2010 |
| TW | 200923308 | A | | 6/2009 |
| TW | 201643361 | A | | 12/2016 |

OTHER PUBLICATIONS

English translation of Notice of Allowence dated Apr. 19, 2019 received in Taiwan Application No. 107102937.
English translation of Notice of Allowance dated Jan. 22, 2018 received in Japanese Application No. 2017-013588.
English translation of Notification of Reasons for refusal dated Aug. 21, 2017 received in Japanese Application No. 2017/018857.
English Translation of Notification of Refusal dated Jan. 8, 2019 received in Taiwan Application No. 107102937.
English translation of Notification of Refusal dated Mar. 5, 2018 received in Japanese Application No. 2017/018857.
International Search Report and Written Opinion received in PCT/JP2018/002406 (English translation of ISR only).
English Translation of the Written Opinion received in PCT/JP2018/002406 dated Apr. 3, 2018.
English Translation of International Preliminary Report on Patentability received in PCT/JP2018/002406 dated Jul. 30, 2019.
English Translation of First Notice of Reasons for Rejection received in CN Application No. 201890000486.0 dated Apr. 9, 2020.

* cited by examiner

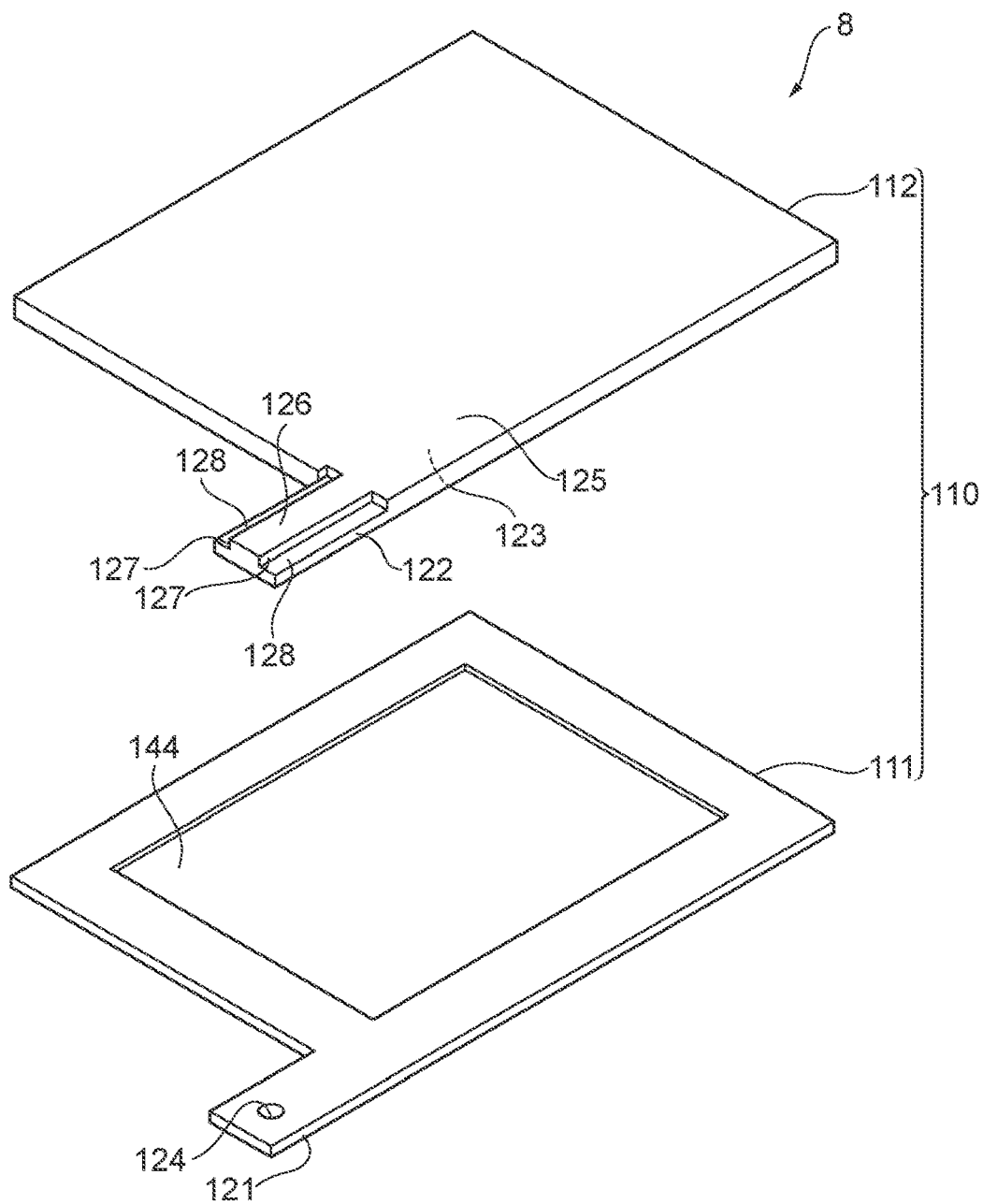
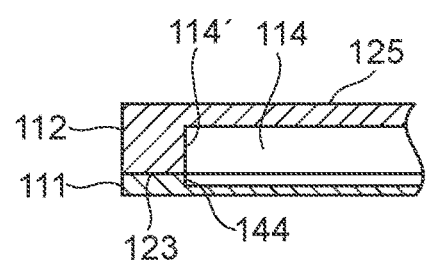
FIG.10A
FIG.10B

VAPOR CHAMBER

CROSS REFERENCE TO RELATED APPLICATIONS

The present application is a continuation application of International Patent Application No. PCT/JP2018/002406 filed on Jan. 26, 2018, which claims the benefit of Japanese Patent Application No. 2017-013588 filed on Jan. 27, 2017 and Japanese Patent Application No. 2017-018857 filed on Feb. 3, 2017. The contents of these applications are incorporated herein by reference in their entirety.

BACKGROUND

Technical Field

The present disclosure relates to a vapor chamber capable of more enlarging a region in which a working fluid is sealed, even in the same installation space, because no nozzle for injection of the working fluid and degassing is attached to the vapor chamber.

Background

The heat generation amount of electronic components such as a semiconductor device mounted on an electric/electronic equipment has increased due to high density mounting or the like due to high functionality, and in recent years, cooling of the electronic components has become more important. As the cooling method of the electronic components, a vapor chamber may be used.

The container of the vapor chamber is provided with a cavity section that is degassed and has a working fluid sealed inside. The working fluid diffuses and recirculates in the cavity section while changing in phase, whereby heat is transported planarly to a heat radiation section from a heat reception section of the vapor chamber. In order to degas the cavity section and inject the working fluid into the cavity section, a nozzle communicating with the cavity section is attached to the container. The nozzle is crushed in a radial direction and sealed after injecting the working fluid, so that in the vapor chamber, the nozzle is left in the state projected with a predetermined projecting amount from the outer periphery of the container. Therefore, in order to install the vapor chamber, a space corresponding to the projecting amount of the nozzle is needed on the outside of the container. However, it is difficult to provide the above described space in a narrow and small space, so that it is sometimes impossible to install the vapor chamber.

Therefore, there is proposed a vapor chamber in which the nozzle is accommodated to be located inside a predetermined contour line in response to the projecting amount of the nozzle (Japanese Patent Application Laid Open No. 2000-258079). However, in Japanese Patent Application Laid Open No. 2000-258079, the nozzle projects from the outer periphery of the container, so that it is necessary to retreat the cavity section around the nozzle, and the heat transportation area by the working fluid is narrowed correspondingly to the retreating amount of the cavity section, that is, the heat radiation efficiency is reduced.

Further, in Japanese Patent Application Laid Open No. 2000-258079, the nozzle which is a separate member from the container is needed, so that the number of components increases, and in production of the vapor chamber, the step of attaching the nozzle is needed, so that productivity is less favorable.

SUMMARY

The present disclosure is related to providing a vapor chamber that is excellent in reduction of the number of components, and productivity, and can prevent reduction in area of a cavity section while reducing a space on an outer periphery of the cavity section in which a working fluid is sealed.

An aspect of the present disclosure is a vapor chamber having a container in which a cavity section is formed by stacked plate-shaped members, a working fluid that is sealed in the cavity section, and a wick structure accommodated in the cavity section, wherein a plate-shaped member on one side forming an outermost layer of the container has at least one projecting portion on one side having a hole portion, and a plate-shaped member on another side forming the outermost layer of the container has at least one projecting portion on another side that is stacked on the projecting portion on one side, and includes a flow path that allows the hole portion and the cavity section to communicate with each other, and an outer periphery of the cavity section is sealed.

In the above described aspect, at least the two plate-shaped members are stacked, and the container having the cavity section is formed. Further, the projecting portion on one side and the projecting portion on the other side are sites that are projected from the outer periphery of the container.

An aspect of the present disclosure is the vapor chamber wherein a number of the stacked plate-shaped members is at least three, and a plate-shaped member of a middle layer that is stacked between the plate-shaped member on one side forming the outermost layer and the plate-shaped member on the other side forming the outermost layer has at least one projecting portion of a middle layer that is stacked on the projecting portion on one side and the projecting portion on the other side, and includes another hole portion communicating with the hole portion and the flow path, and a frame portion forming an inner side surface of the cavity section.

In the above described aspect, at least three plate-shaped members are stacked, and the container having the cavity section is formed. Of the plate-shaped members, the frame portion of the plate-shaped member of the middle layer functions as a spacer that forms the cavity section. Further, the projecting portion of the middle layer is a site that is projected from the outer periphery of the container.

An aspect of the present disclosure is the vapor chamber having a sealed portion of the flow path, on a cavity section side from the hole portion.

An aspect of the present disclosure is the vapor chamber, wherein a cut portion of the projecting portion on one side and the projecting portion on the other side which are stacked is formed, in an outside of the sealed portion.

In the above described aspect, the projecting portion on one side and the projecting portion on the other side which are stacked are cut, on a tip end side of the projecting portions from the sealed portion of the flow path.

An aspect of the present disclosure is the vapor chamber, wherein the cut portion does not project from the outer periphery of the container. In the above described aspect, the projecting portion on one side and the projecting portion on the other side are cut off from base portions of the projecting portion on one side and the projecting portion on the other side.

An aspect of the present disclosure is the vapor chamber, wherein the flow path is formed by sheet metal processing.

An aspect of the present disclosure is the vapor chamber, wherein the hole portion and the other hold portion are circular in plan view, and have diameters of 0.1 mm to 5 mm. In the present specification, "plan view" means an aspect visually recognized from a perpendicular direction to the plane portion of the vapor chamber.

An aspect of the present disclosure is the vapor chamber, wherein the flow path has a width of 0.1 mm to 5 mm, a height of 0.1 mm to 5 mm, and a length of 5 mm to 150 mm.

An aspect of the present disclosure is the vapor chamber, wherein a material of the container is at least one kind of metal selected from a group including a stainless steel, a copper, a copper alloy, an aluminum, an aluminum alloy, a tin, a tin alloy, a titanium, a titanium alloy, a nickel and a nickel alloy.

An aspect of the present disclosure is a vapor chamber having a container in which a cavity section is formed by a plate-shaped member on one side and a plate-shaped member on another side that is stacked on the plate-shaped member on one side, a working fluid that is sealed in the cavity section, and a wick structure accommodated in the cavity section, wherein the plate-shaped member on one side has at least one projecting portion on one side having a hole portion, the plate-shaped member on the other side has at least one projecting portion on another side that is stacked on the projecting portion on one side, and includes a flow path that allows the hole portion and the cavity section to communicate with each other, a recessed part that is formed on a surface facing the plate-shaped member on one side of the plate-shaped member on the other side forms at least a part of the cavity section, the flow path is a recessed groove that is formed on a surface facing the projecting portion one side, of the projecting portion on the other side, and a step portion that is a step in a direction of the projecting portion on one side is formed along the flow path, on a surface that does not face the projecting portion on one side, of the projecting portion on the other side, and an outer periphery of the cavity section is sealed.

In the above described aspect, the projecting portion on one side and the projecting portion on the other side are sites that are projected from the outer periphery of the container. Further, in the projecting portion on the other side, the recessed groove is formed on the surface facing the projecting portion on one side, and the step portion that is the step in the recessed groove direction is formed on the opposite surface to the surface where the recessed groove is formed.

An aspect of the present disclosure is the vapor chamber, wherein the step portion is formed on each of both edge portions of the projecting portion on the other side.

In the above described aspect, the step portions provided along the recessed groove are formed on both side edge portions of the projecting portion on the other side with the recessed groove between the step portions.

An aspect of the present disclosure is the vapor chamber having a sealed portion of the flow path, at the cavity section side from the hole portion.

An aspect of the present disclosure is the vapor chamber, wherein a cut portion of the projecting portion on one side and the projecting portion on the other side which are stacked are formed, in an outside from the sealed portion.

In the above described aspect, the projecting portion on one side and the projecting portion on the other side which are stacked are cut, on the tip end side of the projecting portions from the sealed portion of the flow path.

An aspect of the present disclosure is the vapor chamber, wherein the cut portion does not project from the outer periphery of the container. In the above described aspect, the projecting portion on one side and the projecting portion on the other side are cut off from base portions of the projecting portion on one side and the projecting portion on the other side.

An aspect of the present disclosure is the vapor chamber, wherein the flow path is formed by etching or cutting.

An aspect of the present disclosure is the vapor chamber, wherein the step portion is formed by etching or cutting. In the above described aspect, the surface of the step portion has a mark of etching or a mark of cutting.

An aspect of the present disclosure is the vapor chamber, wherein the hole portion is circular in plan view, and has a diameter of 0.1 mm to 5 mm.

An aspect of the present disclosure is the vapor chamber, wherein the flow path has a width of 0.1 mm to 5 mm, a depth of 0.1 mm to 5 mm, and a length of 5 mm to 150 mm.

An aspect of the present disclosure is the vapor chamber, wherein a material of the container is at least one kind of metal selected from a group including a stainless steel, a copper, a copper alloy, an aluminum, an aluminum allay, a tin, a tin alloy, a titanium, a titanium alloy, a nickel and a nickel alloy.

According to the aspect of the present disclosure, the projecting portion on one side can have a space for providing the hole portion, and the projecting portion on the other side can have the same space as the projecting portion on one side, that is, it is possible to reduce projecting amounts of the projecting portion on one side and the projecting portion on the other side, so that it is possible to prevent reduction in area of the cavity section while reducing the space of the outer periphery of the cavity section. Accordingly, even when the installation space of the vapor chamber is narrow and small, it is possible to ensure the area of the cavity section and obtain excellent heat radiation efficiency.

According to the aspect of the present disclosure, it is not necessary to prepare a separate member from the container, such as a nozzle, in order to degas the cavity section and inject the working fluid into the cavity section, so that it is possible to reduce the number of components. Further, according to the aspect of the present disclosure, in production of the vapor chamber, the step of attaching a separate member from the container, such as a nozzle, to the container is not necessary, so that excellent productivity is provided.

According to the aspect of the present disclosure, the number of plate-shaped members which are stacked is at least three, and the plate-shaped member of the middle layer has the frame portion forming the inner side surface of the cavity section, whereby it is possible to complicate the shape in plan view of the container, so that the degree of freedom of design of the vapor chamber is increased.

According to the aspect of the present disclosure, the cut portion of the stacked projecting portions are formed on the outside from the sealed portion, whereby it is possible to reduce the projecting amounts of the projecting portions more, so that it is possible to ensure the area of the cavity section more sufficiently while reducing the space of the outer periphery of the cavity section more.

According to the aspect of the present disclosure, the step portion which is the step toward the direction of the projecting portion on one side along the flow path is formed on the surface that does not face the projecting portion on one side, of the projecting portion on the other side, whereby crushing of the flow path is easy, and as a result, it is possible to simplify sealing of the flow path.

BRIEF DESCRIPTION OF THE DRAWINGS

FIG. 10A is an exploded perspective view of a vapor chamber according to an eighth embodiment of the present disclosure before sealing, and FIG. 10B is an explanatory view of a cavity section of the vapor chamber according to the eighth embodiment of the present disclosure.

DETAILED DESCRIPTION

Figure 1:
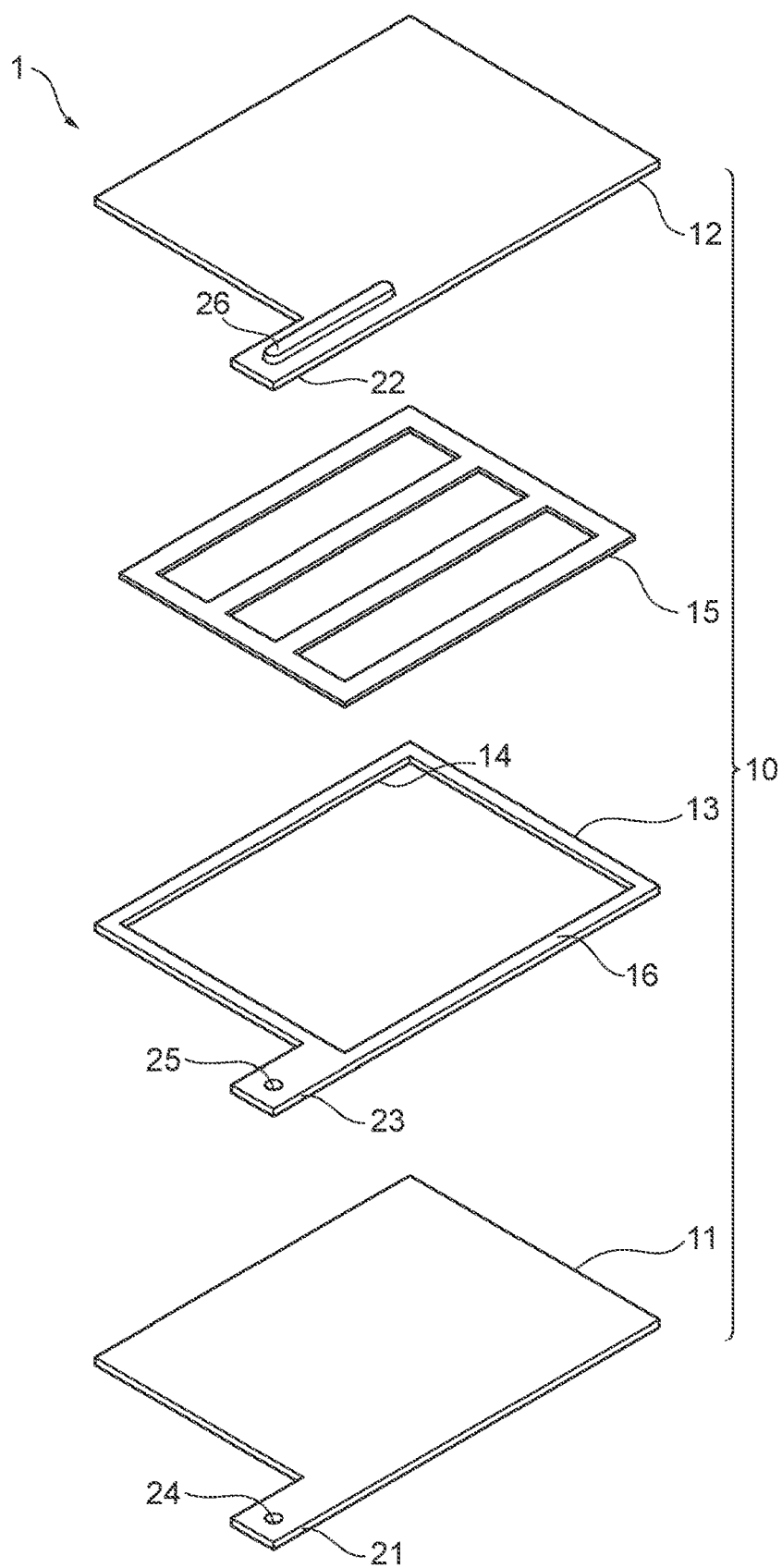
FIG. 1 is an exploded perspective view of a vapor chamber according to a first embodiment of the present disclosure before sealing.

Hereinafter, the vapor chamber according to a first embodiment of the present disclosure will be described with use of the drawings. As illustrated in FIG. 1, a vapor chamber 1 according to the first embodiment has a planar container 10 having a cavity section 14, and a working fluid (not illustrated) sealed in the cavity section 14. Further, in the cavity section 14, a wick structure 15 having a capillary force is accommodated.

The container 10 has a structure in which a plate-shaped member 11 on one side forming an outermost layer, a plate-shaped member 12 on another side facing the plate-shaped member 11 on one side and also forming the outermost layer, a plate-shaped member 13 of a middle layer disposed between the plate-shaped member 11 on one side and the plate-shaped member 12 on the other side are stacked. Accordingly, the container 10 of the vapor chamber 1 has a three-layer structure. The plate-shaped member 11 on one side, the plate-shaped member 12 on the other side and the plate-shaped member 13 of the middle layer are stacked in mutually overlapping positions in plan view.

The plate-shaped member 11 on one side and the plate-shaped member 12 on the other side are respectively members in flat-plate shapes. The plate-shaped member 13 of the middle layer is a frame-shaped member, and an outer surface of a frame portion 16 forms an outer side surface of the container 10. Further, an inner surface of the frame portion 16 forms a side surface of the cavity section 14. Accordingly, a hollow portion of the container 10 formed by the inner surface of the frame portion 16 of the plate-shaped member 13 of the middle layer, an inner surface of the plate-shaped member 11 on one side and an inner surface of the plate-shaped member 12 of the other side forms the cavity section 14. A shape in plan view of the cavity section 14 is arbitrarily selectable in accordance with a usage condition or the like of the vapor chamber 1, but is rectangular in the vapor chamber 1.

As illustrated in FIG. 1, the plate-shaped member 11 on one side is provided with a projecting region (a projecting portion 21 on one side) that extends in a planar direction of the container 10, and is in a flat-plate shape and a strip shape. In the vapor chamber 1, one projecting portion 21 on one side is provided. The projecting portion 21 on one side extends on a same plane as the plate-shaped member 11 on one side. Accordingly, the projecting portion 21 on one side is located outside of the cavity section 14 in plan view. Further, the plate-shaped member 12 on the other side is provided with a projecting region (a projecting portion 22 on the other side) that is extended in the planar direction of the container 10 and is in a flat-plate shape and a strip shape. In the vapor chamber 1, one projecting portion 22 on the other side is provided. The projecting portion 22 on the other side extends on a same plane as the plate-shaped member 12 on the other side. Accordingly, the projecting portion 22 on the other side is located outside of the cavity section 14 in plan view. Further, the projecting portion 22 on the other side is provided in a position overlapping the projecting portion 21 on one side in plan view. Further, the plate-shaped member 13 of the middle layer is provided with a projecting region (a projecting portion 23 of a middle layer) that is extended in the planar direction of the container 10 and is in a flat-plate shape and a strip shape. In the vapor chamber 1, one projecting portion 23 of the middle layer is provided. The projecting portion 23 of the middle layer extends on a same plane as the plate-shaped member 13 of the middle layer. Accordingly, the projecting portion 23 of the middle layer is located outside of the cavity section 14 in plan view. Further, the projecting portion 23 of the middle layer is provided in a position overlapping the projecting portion 21 on one side and the projecting portion 22 on the other side in plan view. Accordingly, in correspondence with the fact that the plate-shaped member 11 on one side, the plate-shaped member 12 on the other side and the plate-shaped member 13 of the middle layer are stacked in mutually overlapping positions in plan view, the projecting portion 21 on one side, the projecting portion 22 on the other side and the projecting portion 23 of the middle layer are stacked in mutually overlapping positions in plan view.

The projecting portion 21 on one side is provided with a first hole portion 24 that is a through-hole. Further, the projecting portion 23 of the middle layer is also provided with a second hole portion 25 that is a through-hole in a position overlapping the first hole portion 24 in plan view. Accordingly, the first hole portion 24 and the second hole portion 25 communicate with each other. Shapes in plan view of the first hole portion 24 and the second hole portion 25 are not specially limited, but are respectively circular in plan view in the vapor chamber 1. Further, sizes of the first hole portion 24 and the second hole portion 25 are not specially limited, but the first hole portion 24 and the second hole portion 25 respectively have diameters of 0.1 mm to 5 mm, for example.

The projecting portion 22 on the other side is provided with a flow path 26 that is recessed in a recessed shape as viewed from the cavity section 14. Accordingly, the flow path 26 is in a mode projected (raised) in a protruded shape from a surface of the projecting portion 22 on the other side.

Figure 2A:
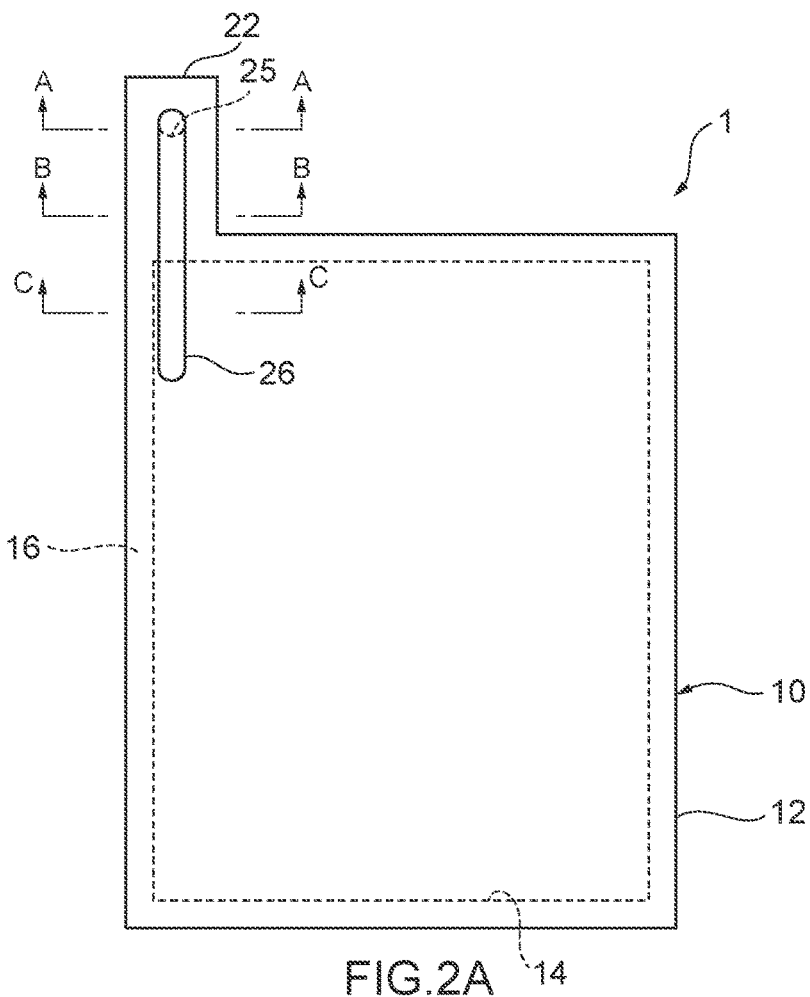
FIG. 2A is a plan view of the vapor chamber according to the first embodiment of the present disclosure before sealing.
Figure 2B:
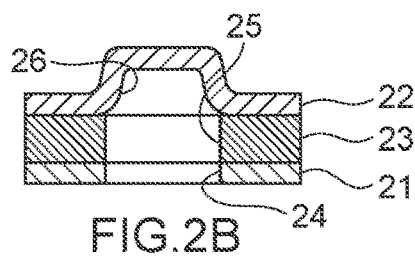
FIG. 2B is an explanatory view of a section along line (A)-(A) in FIG. 2A.

As illustrated in FIG. 2A and FIG. 2B, the flow path 26 is provided in a position overlapping the first hole portion 24 and the second hole portion 25 in plan view. Accordingly, the flow path 26 communicates with the first hole portion 24 and the second hole portion 25. Further, as illustrated in FIG. 2A and FIG. 2D, the flow path 26 extends to a position overlapping the cavity section 14 from the position overlapping the first hole portion 24 and the second hole portion 25 in plan view. Accordingly, the flow path 26 communicates with the cavity section 14. That is, the first hole portion 24 and the second hole portion 25, and the cavity section 14 communicate with one another through the flow path 26. In the vapor chamber 1, one end portion of the flow path 26 communicates with the first hole portion 24 and the second hole portion 25, and another end portion of the flow path 26 communicates with the cavity section 14.

Figure 2C:
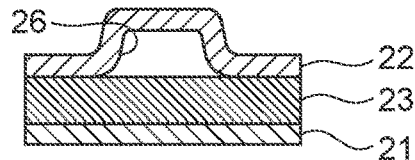
FIG. 2C is an explanatory view of a section along line (B)-(B) in FIG. 2A.
Figure 2D:
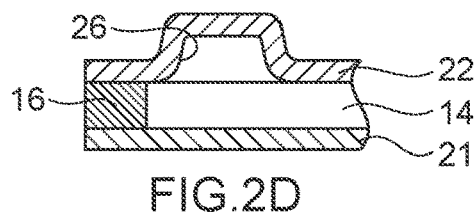
FIG. 2D is an explanatory view of a section along line (C)-(C) in FIG. 2A.

As illustrated in FIG. 2C, of the flow path 26, a central portion that is a site between a site (that is, one end portion) overlapping the first hole portion 24 and the second hole portion 25 in plan view and a site (that is, another end portion) overlapping the cavity section 14 in plan view is located on a surface of the projecting portion 23 of the middle layer.

A production method of the flow path 26 is not specially limited, but sheet metal processing using a press machine, such as drawing can be cited. Further, a size of the flow path 26 is not specially limited, but in the vapor chamber 1, the flow path 26 has a width of 0.1 mm to 5 mm, a height of 0.1 mm to 5 mm and a length of 5 mm to 150 mm, for example. Further, a shape in plan view of the flow path 26 is not specially limited, but is linear in the vapor chamber 1.

As a material of the container 10, for example, a stainless steel, a copper, a copper alloy, an aluminum, an aluminum alloy, a tin, a tin alloy, a titanium, a titanium alloy, a nickel, a nickel alloy and the like can be cited.

A thickness of the vapor chamber 1 except for the site of the flow path 26 is not specially limited, but 0.2 mm to 10 mm can be cited, for example. Further, a thickness of the cavity section 14 is not specially limited, but 0.1 mm to 9.9 mm can be cited, for example. Further, plate thicknesses of the plate-shaped member 11 on one side and the plate-shaped member 12 on the other side are not specially limited, but 0.05 mm to 3 mm can be cited for each, for example.

As a working fluid that is sealed in the cavity section 14, any working fluid is arbitrarily selectable in accordance with adaptation with the material of the container 10, and, for example, water, fluorocarbons, cyclopentane, ethylene glycol, a mixture of these substances and the like can be cited. The wick structure 15 is not specially limited, but, for example, a sintered body of metal powder such as copper powder, metal mesh formed of a metal wire, a groove, unwoven fabric and the like can be cited. In the vapor chamber 1, a metal mesh formed into a ladder shape in plan view is used.

Thereafter, a method for injecting the working fluid into the cavity section 14 of the vapor chamber 1 according to the first embodiment will be described with use of the drawings. Before injecting the working fluid into the cavity section 14, an outer periphery of the container 10 including outer peripheries of the projecting portions is welded (for example, laser welding, a resistance welding or the like) and sealed in advance.

As illustrated in FIG. 2A to FIG. 2D, the first hole portion 24 communicates with the cavity section 14 via the second hole portion 25 and the flow path 26. Accordingly, a degassing device (not illustrated) is attached to the first hole portion 24 first, degassing treatment of an inside of the cavity section 14 is performed from the first hole portion 24 through the second hole portion 25 and the flow path 26, and the inside of the cavity section 14 is brought into a decompressed state. That is, the first hole portion 24 and the second hole portion 25 function as a degassing port of the cavity section 14. Further, the flow path 26 functions as a discharge path of gas that is caused to flow to the first hole portion 24 that is the degassing port from the cavity section 14. After the degassing treatment, the working fluid (not illustrated) in a liquid phase is injected into the cavity section 14 through the second hole portion 25 and the flow path 26 from the first hole portion 24. That is, the first hole portion 24 and the second hole portion 25 also function as an injection port of the working fluid of the liquid phase. Further, the flow path 26 also functions as a supply path of the working fluid of the liquid phase that causes the working fluid of the liquid phase to flow to the cavity section 14 from the first hole 24 and the second hole portion 25 that are the injection port. Here, the working fluid of the liquid phase is injected after the inside of the cavity section 14 is brought into the decompressed state, but instead of this, the degassing treatment of the inside of the cavity section 14 may be performed after the working fluid in the liquid phase is injected into the cavity section 14.

After the working fluid of the liquid phase is injected into the cavity section 14 for which the degassing treatment is performed, the flow path 26 is sealed and a sealed portion (not illustrated) is formed on the projecting portion by crushing a central portion of the flow path 26 (a site between a site corresponding to the first hole portion 24 and the second hole portion 25, and a site corresponding to the cavity section 14) onto the projecting portion 23 of the middle layer by a caulking jig or the like. By forming the sealed portion in the projecting portion, the working fluid is sealed in the decompressed cavity section 14. Further, by welding (for example, laser welding, resistance welding or the like) the sealed portion on the projecting portion, the sealed portion can be completely sealed. Accordingly, in the sealed vapor chamber 1, the flow path 26 sealed in the site between the site corresponding to the first hole portion 24 and the second hole portion 25 and the site corresponding to the cavity section 14 is in a mode left to the position of the cavity section 14 from the position (position of the projecting portions) of the first hole portion 24 and the second hole portion 25.

In the vapor chamber 1 according to the first embodiment, the projecting portion 21 on one side can have a space where the first hole 24 is provided, the projecting portion 23 of the middle layer can have a space where the second hole portion 25 is provided respectively, and the projecting portion 22 on the other side can have the same space as the spaces of the projecting portion 21 on one side and the projecting portion 23 of the middle layer, so that the projecting amounts of the projecting portion 21 on one side, the projecting portion 23 of the middle layer and the projecting portion 22 on the other side can be reduced. Accordingly, it is possible to prevent reduction in an area of the cavity section 14 where the working fluid exhibits heat transportation characteristics while reducing the space of the outer periphery of the cavity section 14. Thereby, even when the installation space of the vapor chamber 1 is narrow and small, it is possible to ensure the area of the cavity section 14, and exhibit excellent heat radiation efficiency.

It is not necessary to prepare a separate member from the container 10 such as a nozzle, in order to degas the cavity section 14 and inject the working fluid into the cavity section 14, so that it is possible to reduce the number of components, in the vapor chamber 1. Further, in the vapor chamber 1, the step of attaching a separate member from the container 10, such as a nozzle, to the container 10 is not necessary in production, so that excellent productivity is provided. Further, in the vapor chamber 1, the number of stacked plate-shaped members is at least three, and the plate-shaped member 13 of the middle layer has the frame portion 16 that forms the inner side surface of the cavity section 14, so that it is possible to complicate the shape in plan view of the container 10, and a degree of freedom of design of the vapor chamber 1 increases.

Further, in the vapor chamber 1, a section of the flow path 26 is in a shape projected in a protruded shape from the surface of the projecting portion 22 on the other side, so that sealing by crushing is easy.

Thereafter, a vapor chamber according to a second embodiment of the present disclosure will be described with use of the drawings. Note that the same components as the components of the vapor chamber according to the first embodiment will be described with use of the same reference signs.

Figure 3A:
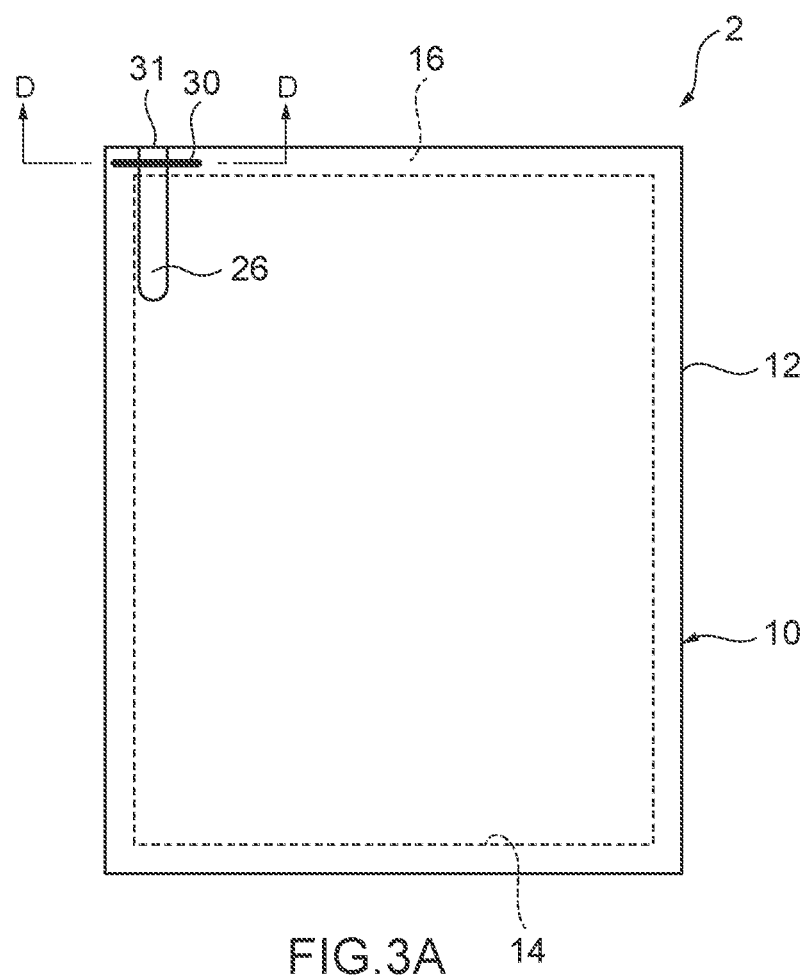
FIG. 3A is a plan view of a vapor chamber according to a second embodiment of the present disclosure after completely sealing.
Figure 3B:
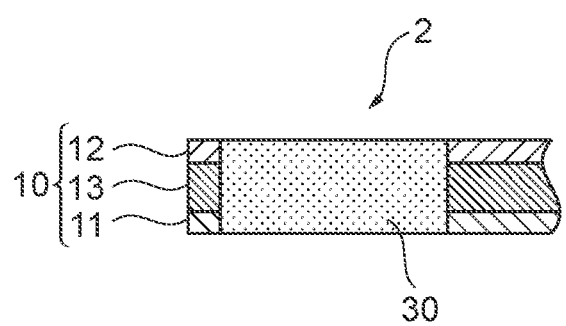
FIG. 3B is an explanatory view of a section along line (D)-(D) section in FIG. 3A.

In the vapor chamber according to the first embodiment, the sealed portion is formed in the central portion of the flow path, and the sealed portion is completely sealed by welding the sealed portion, whereas as illustrated in FIGS. 3A and 3B, in a vapor chamber 2 according to the second embodiment, a sealed portion formed in the central portion of the flow path 26 is completely sealed by welding the sealed portion, and thereafter, the projecting portion on one side, the projecting portion of the middle layer and the projecting portion on the other side which are stacked are cut, on a tip end portion from the sealed portion.

In the vapor chamber 2, a welded portion 30 is formed by forming the sealed portion by crushing the central portion of the flow path 26 onto the frame portion 16 of the plate-shaped member 13 of the middle layer by a caulking jig or the like, and further welding the sealed portion (for example, laser welding, resistance welding or the like). On an outside from the formed sealed portion where the welded portion 30 is formed, that is, on a tip end portion side of the projecting section, the projecting portion on one side, the projecting portion of the middle layer and the projecting portion on the other side which are stacked are cut, and a cut portion 31 of the stacked projecting portions is formed. Accordingly, in the sealed vapor chamber 2, the flow path 26 sealed by the welded portion 30 that is formed in an edge portion of the container 10 is in a mode left from a position of the frame portion 16 to a position of the cavity section 14.

As illustrated in FIG. 3A, in the vapor chamber 2, the projecting portion on one side, the projecting portion of the middle layer and the projecting portion on the other side which are stacked are all cut at base portions of the projecting portion on one side, the projecting portion of the middle layer and the projecting portion on the other side. Accordingly, a cut section of the cut portion 31 does not project from the outer periphery of the container 10.

Since the stacked projecting portions are cut, it is possible to reduce the projecting amounts of the stacked projecting portions more, and since the stacked projecting portions are cut at the base portions, the stacked projecting portions are completely removed in the vapor chamber 2, so that it is possible to ensure the area of the cavity section 14 more sufficiently while more reducing the space of the outer periphery of the cavity section 14.

Next, a vapor chamber according to a third embodiment of the present disclosure will be described with use of the drawings. Note that the same components as the components of the vapor chambers according to the first and second embodiments will be described by using the same reference signs.

Figure 4A:
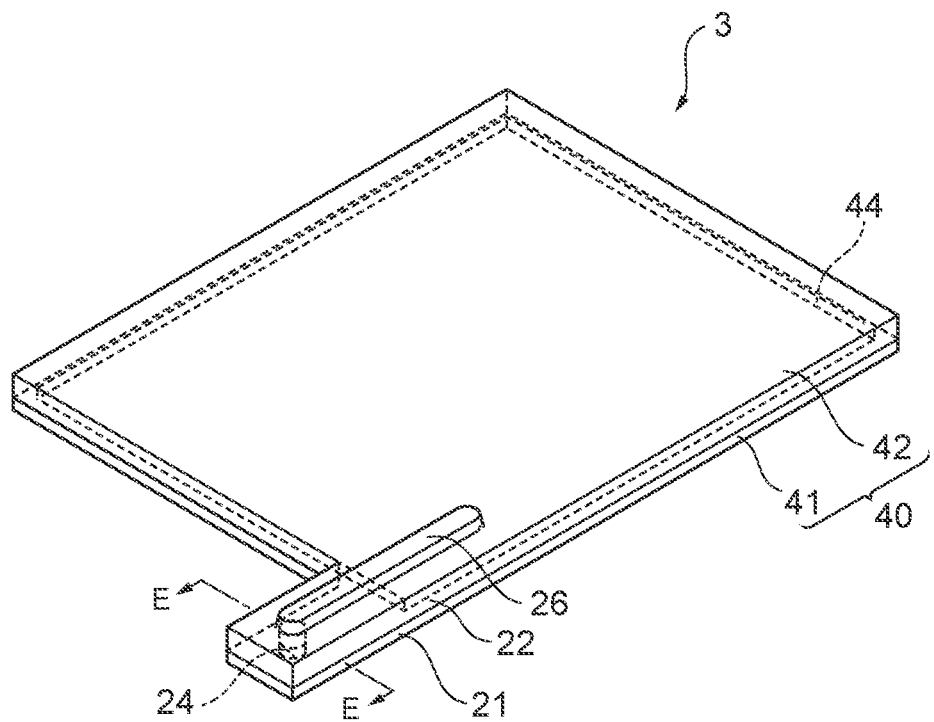
FIG. 4A is a perspective view of a vapor chamber according to a third embodiment of the present disclosure before sealing.
Figure 4B:
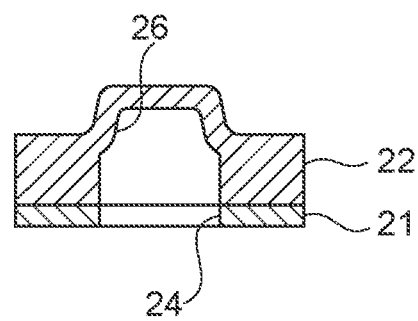
FIG. 4B is an explanatory view of a section along line (E)-(E) in FIG. 4A.

In each of the vapor chambers according to the first and second embodiments, the container is of a three-layer structure in which the plate-shaped member on one side, the plate-shaped member of the middle layer and the plate-shaped member on the other side are stacked, but instead of this, as illustrated in FIGS. 4A and 4B, in the vapor chamber 3 according to the third embodiment, a two-layer structure in which a plate-shaped member 41 on one side and a plate-shaped member 42 on another side facing the plate-shaped member 41 on one side are stacked is adopted.

As illustrated in FIG. 4A, in the vapor chamber 3, a container 40 having a cavity section 44 is formed by overlapping the plate-shaped member 41 on one side which is a lower plate, and the plate-shaped member on the other side 42 which is an upper plate on each other. In a central portion of the plate-shaped member 42 on the other side, a recessed part viewed from the plate-shaped member 41 on one side is provided. The recessed part of the plate-shaped member 42 on the other side forms the cavity section 44 of the container 40. On the projecting portion 22 on the other side of the plate-shaped member 42 on the other side, the flow path 26 which is recessed in the recessed shape viewed from the plate-shaped member 41 on one side is provided. The flow path 26 is in a mode projected (raised) into a protruded shape from the surface of the projecting portion 22 on the other side. The flow path 26 extends to a position overlapping the cavity section 44 in plan view. Accordingly, the flow path 26 communicates with the cavity section 44.

The plate-shaped member 41 on one side is a member of a same structure as the plate-shaped members on one side of the vapor chambers according to the first and second embodiments. Accordingly, the projecting portion 21 on one side of the plate-shaped member 41 on one side is provided with the first hole portion 24 which is a through-hole. The flow path 26 is provided in the position overlapping the first hole portion 24 in plan view.

Accordingly, as illustrated in FIG. 4B, in the vapor chamber 3, the flow path 26 on the projecting portion 22 on the other side communicates with the first hole portion 24 of the projecting portion 21 on one side. That is, the first hole portion 24 and the cavity section 44 communicate with each other through the flow path 26.

In the vapor chamber 3, a sealed portion (not illustrated) is formed in the projecting portions by sealing the flow path 26 by crushing the central portion of the flow path 26 on the plate-shaped member 42 on the other side onto the surface of the projecting portion 21 on one side of the plate-shaped member 41 on one side by a caulking jig or the like, after injecting the working fluid (not illustrated) of a liquid phase to the cavity section 44 for which degassing treatment is performed. By forming the sealed portion in the projecting portions, the working fluid is sealed in the decompressed cavity section 44. Further, by welding the sealed portion of the projecting portions (for example, laser welding, resistance welding or the like), it is possible to seal the sealed portion completely.

In the vapor chamber 3 according to the third embodiment, it is possible to reduce the projecting amounts of the projecting portion 21 on one side and the projecting portion 22 on the other side similarly to the vapor chamber according to the first embodiment. Accordingly, it is possible to prevent reduction in area of the cavity section 44 where the working fluid exhibits heat transportation characteristics while reducing the space of the outer periphery of the cavity section 44.

Next, a vapor chamber according to a fourth embodiment of the present disclosure will be described with use of the drawings. Note that the same components as the components of the vapor chambers according to the first to third embodiments will be described with use of the same reference signs.

Figure 5:
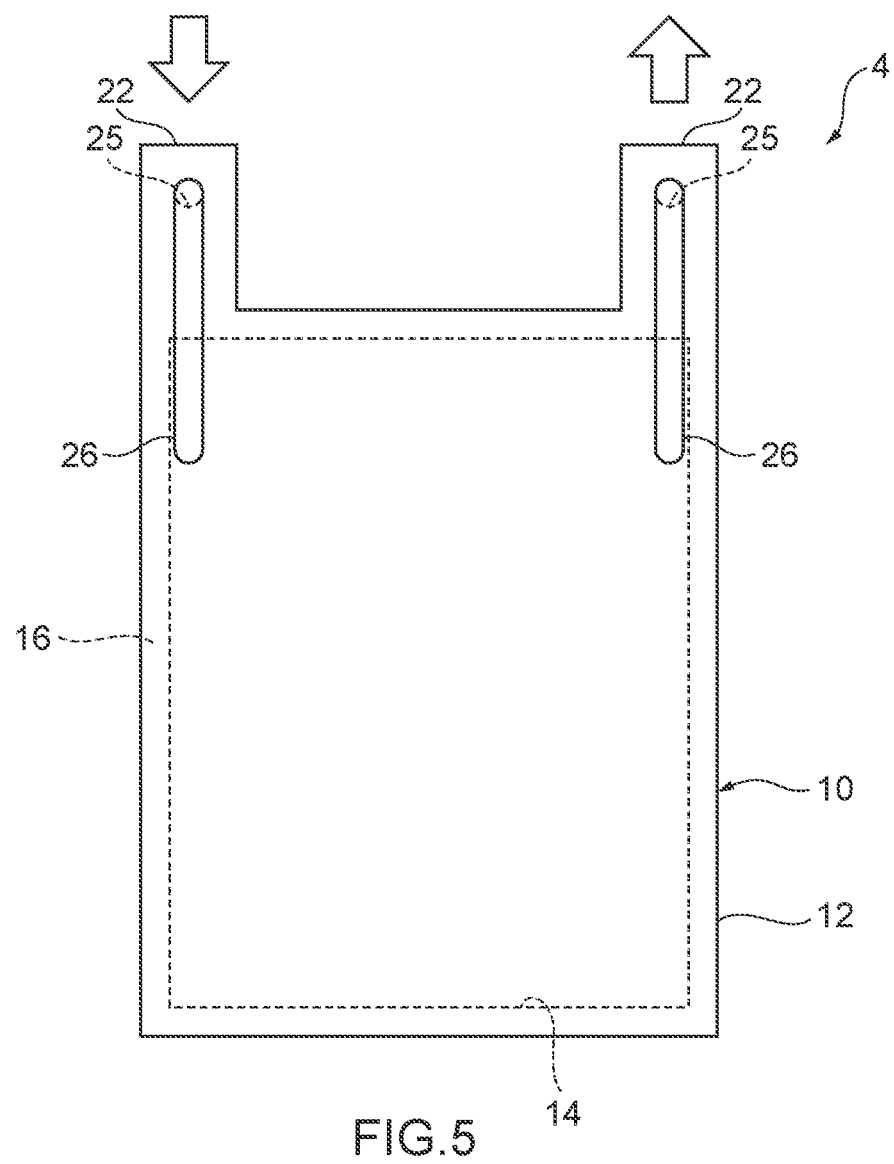
FIG. 5 is a plan view of a vapor chamber according to a fourth embodiment of present disclosure before sealing.

In the vapor chamber according to the above described first embodiment, one set of stacked projecting portions is provided, but instead of this, in the vapor chamber 4 according to the fourth embodiment, a plurality (two in FIG. 5) of sets of stacked projecting portions are provided as illustrated in FIG. 5. That is, in the vapor chamber 4, a plurality (two in FIG. 5) of projecting portions on one side, a plurality (two in FIG. 5) of the projecting portions 22 on the other side, and a plurality (two in FIG. 5) of the projecting portions of the middle layer are respectively provided. Further, in correspondence with the fact that the plate-shaped member on one side, the plate-shaped member 12 on the other side and the plate-shaped member of the middle layer are stacked in mutually overlapping positions in plan view, two of the projecting portions on one side, two of the projecting portions 22 on the other side and two of the projecting portions of the middle layer are respectively stacked in mutually overlapping positions in plan view, and two sets of stacked projecting portions (first stacked projecting portions and second stacked projecting portions) are formed.

The positions of the stacked projecting portions are not specially limited, but in the vapor chamber 4, at each of end portions facing each other of the container 10, one stacked projecting portions are provided.

In the vapor chamber 4, of the two sets of stacked projecting portions, from the first stacked projecting portions (stacked projecting portions at a left side in FIG. 5), a working fluid of a liquid phase is injected into the cavity section 14, degassing treatment of the inside of the cavity section 14 is performed from the second stacked projecting portions (stacked projecting portions at a right side in FIG. 5), and the inside of the cavity section 14 is brought into a decompressed state. That is, in the vapor chamber 4, the stacked projecting portions for injecting the working fluid of a liquid phase and the stacked projecting portions for degassing the cavity section 14 are provided.

In the vapor chamber 4 according to the fourth embodiment, it is possible to reduce the projecting amount of the stacked projecting portions similarly to the vapor chamber according to the first embodiment having the single stacked projecting portions, so that it is possible to prevent reduction in area of the cavity section 14 where the working fluid exhibits heat transportation characteristics while reducing the space of the outer periphery of the cavity section 14.

Next, other embodiments of the vapor chamber of the present disclosure will be described. Although in the vapor chambers according to the first, second and fourth embodiments, the containers are of a three-layer structure, but a multilayer structure with four layers or more may be adopted by stacking a plurality of plate-shaped members of middle layers. Further, in the vapor chamber according to the first embodiment, the sealed portion is formed in the projecting portions by crushing the central portion of the flow path onto the projecting portion surface of the middle layer, and the sealed portion is welded, but instead of this, the stacked projecting portions may be cut, on the tip end portion side from the welded sealed portion. Further, in each of the vapor chambers according to the third and fourth embodiments, tip end portions of the stacked projecting portions may be cut, on the tip end portion side from the welded sealed portion on the projecting portions. Further, in the vapor chamber according to the third embodiment, the one set of stacked projecting portions is provided, but instead of this, a plurality of sets of stacked projecting portions may be provided. Further, with respect to the vapor chambers of the above described respective embodiments, after sealing of the flow path, if necessary, the entire flow path may be crushed by pressing or the like until the flow path becomes a same plane as a surface of the projecting portion on the other side. Note that by crushing the entire flow path, a crushed mark of the flow path is formed on the container.

Figure 6A:
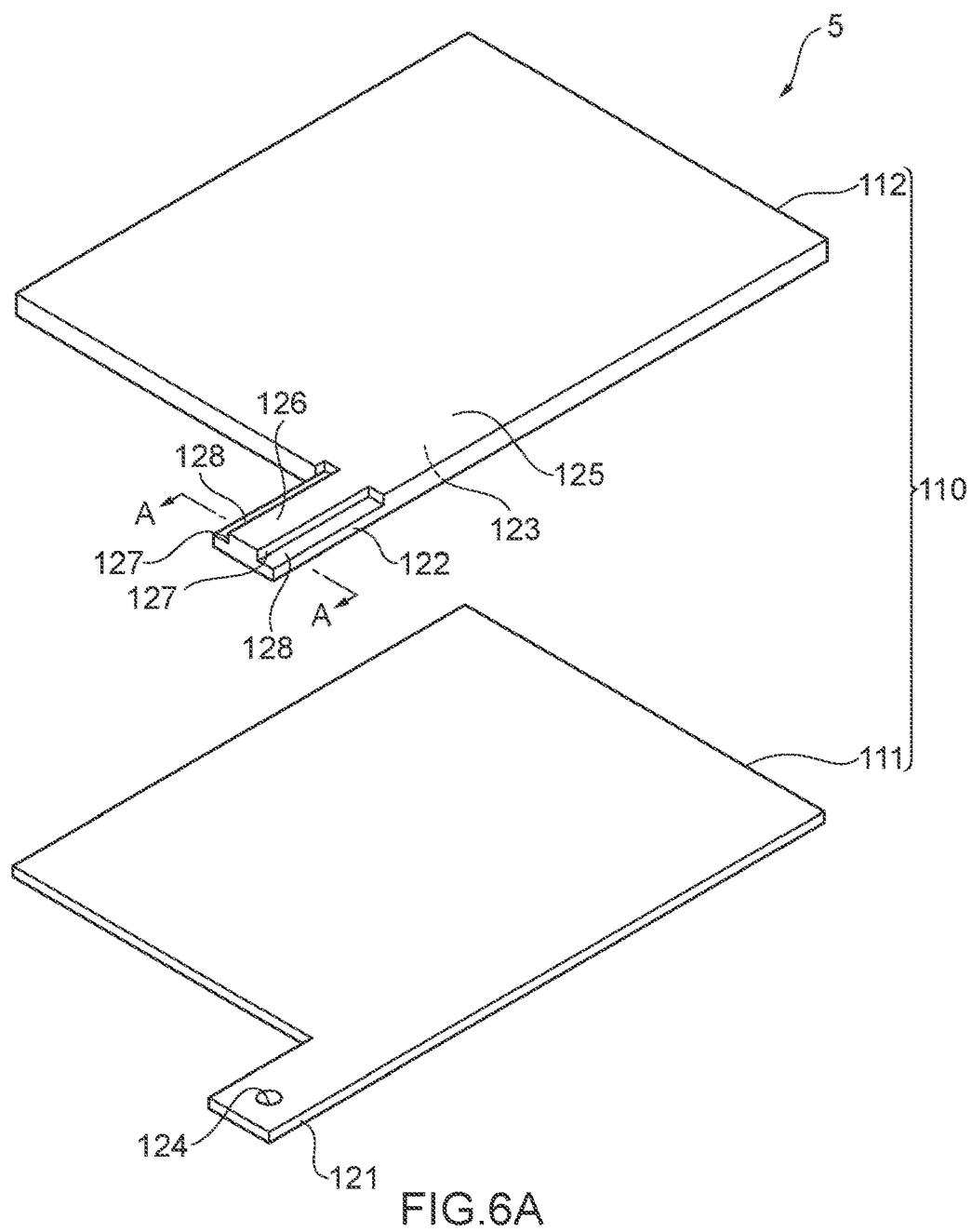
FIG. 6A is an exploded perspective view of a vapor chamber according to a fifth embodiment of the present disclosure before sealing.
Figure 7A:
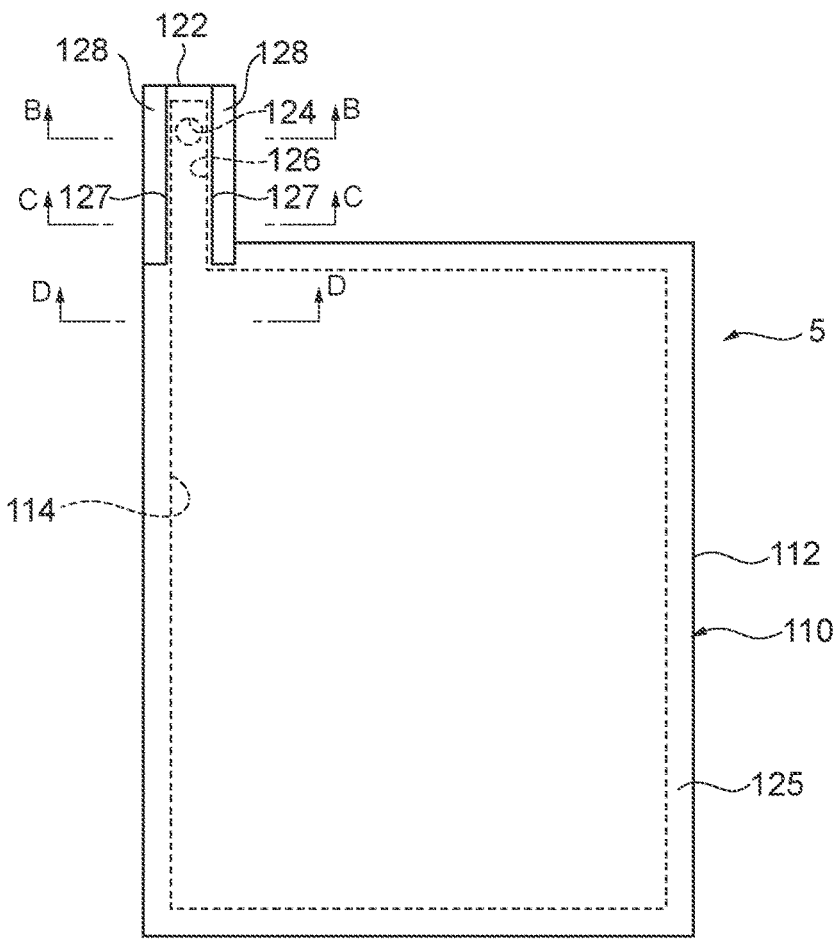
FIG. 7A is a plan view of the vapor chamber according to the fifth embodiment of the present disclosure before sealing.

Hereinafter, a vapor chamber according to a fifth embodiment of the present disclosure will be described with use of the drawings. As illustrated in FIG. 6A and FIG. 7A, the vapor chamber 5 according to the fifth embodiment has a planar type container 110 having a cavity section 114, and a working fluid (not illustrated) sealed in the cavity section 114. Further, in the cavity section 114, a wick structure (not illustrated) having a capillary force is accommodated.

A plate-shaped member 111 on one side, and a plate-shaped member 112 on the another side facing the plate-shaped member 111 on one side are overlaid on each other, whereby the container 110 having the cavity section 114 is formed. Accordingly, the container 110 is of a structure in which the plate-shaped member 111 on one side and the plate-shaped member 112 on the other side are stacked, and is of a two-layer structure. The plate-shaped member 111 on one side and the plate-shaped member 112 on the other side are stacked in mutually overlapping positions in plan view. The plate-shaped member 111 on one side and the plate-shaped member 112 on the other side are respectively members in flat-plate shapes.

Figure 7B:
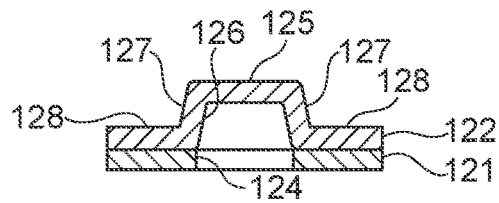
FIG. 7B is an explanatory view of a section along line (B)-(B) in FIG. 7A.
Figure 7C:
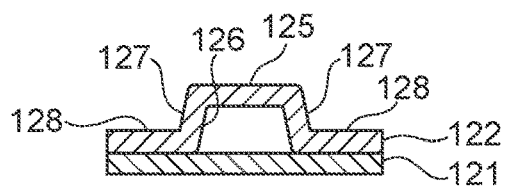
FIG. 7C is an explanatory view of a section along line (C)-(C) in FIG. 7A.
Figure 7D:
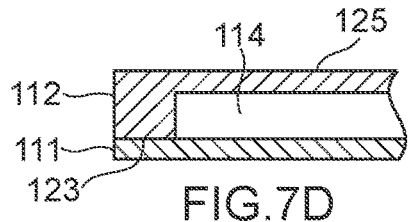
FIG. 7D is an explanatory view of a section along line (D)-(D) in FIG. 7A.

As illustrated in FIGS. 7A and 7D, a recessed part as viewed from the plate-shaped member 111 on one side is provided in a central portion of the plate-shaped member 112 on the other side. That is, of both surfaces of the plate-shaped member 12 on the other side, the recessed portion is formed on a back surface 123 that is a surface facing the plate-shaped member 111 on one side. Of both the surfaces of the plate-shaped member 112 on the other side, a site corresponding to a position of the recessed part, of a front surface 125 which is a surface that does not face the plate-shaped member 111 on one side is on a same plane as a site corresponding to an edge portion of the recessed part. Therefore, the site corresponding to the position of the recessed part, of the plate-shaped member 112 on the other side is not in a protruded shape. On the other hand, the central portion of the plate-shaped member 111 on one side is not provided with a recessed part, but is in a planar shape. Accordingly, the recessed part of the plate-shaped member 112 on the other side forms the cavity section 114 of the container 110. That is, a hollow section of the container 110, which is formed by an inner surface of the recessed part of the plate-shaped member 112 on the other side and an inner surface of the plate-shaped member 111 on one side is the cavity section 114. A shape in plan view of the cavity section 114 is arbitrarily selectable in accordance with the usage condition of the vapor chamber 5 or the like, but is rectangular in the vapor chamber 5.

As illustrated in FIG. 6A and FIG. 7A, the plate-shaped member 111 on one side is provided with a projecting region (a projecting portion 121 on one side) that is extended in a planer direction of the container 110, and is in a flat-plate shape and a strip shape. In the vapor chamber 5, the one projecting portion 121 on one side is provided. The projecting portion 121 on one side extends on a same plane as the plate-shaped member 111 on one side. Accordingly, the projecting portion 121 on one side is located outside of the cavity section 114 in plan view. Further, the plate-shaped member 112 on the other side is provided with a projecting region (a projecting portion 122 on another side) that is extended in the planer direction of the container 110 and is in a flat-plate shape and a strip shape. In the vapor chamber 5, the one projecting portion 122 on the other side is provided. The projecting portion 122 on the other side extends on a same plane as the plate-shaped member 112 on the other side. Accordingly, the projecting portion 122 on the other side is located outside of the cavity section 114 in plan view. Further, the projecting portion 122 on the other side is provided in a position overlapping the projecting portion 121 on one side in plan view. Accordingly, in correspondence with the fact that the plate-shaped member 111 on one side and the plate-shaped member 112 on the other side are stacked in mutually overlapping positions in plan view, the projecting portion 121 on one side and the projecting portion 122 on the other side are stacked in mutually overlapping positions in plan view.

The projecting portion 121 on one side is provided with a hole portion 124 that is a through-hole. A shape in plan view of the hole portion 124 is not specially limited, but is circular in plan view in the vapor chamber 5. Further, a size of the hole portion 124 is not specially limited, but the hole portion 124 has a diameter of 0.1 to 5 mm, for example.

Figure 6B:
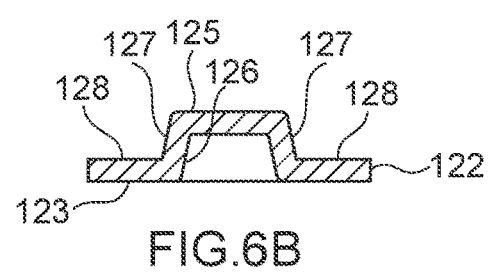
FIG. 6B is an explanatory view of a section along line (A)-(A) in FIG. 6A.

As illustrated in FIG. 6B, and FIGS. 7B and 7C, the projecting portion 122 on the other side is provided with a flow path 126 in a recessed shape as viewed from the projecting portion 121 on one side (the plate-shaped member 111 on one side). The flow path 126 is a recessed groove that is provided in the projecting portion 122 on the other side in a position (facing position) overlapping the projecting portion 121 on one side, of the back surface 123 of the plate-shaped member 112 on the other side. Accordingly, as illustrated in FIG. 6A, the flow path 126 is not in a mode projecting (rising) from a front surface 125 of the plate-shaped member 112 on the other side. That is, of the front surface 125 of the plate-shaped member 112 on the other side, a site corresponding to the position of the flow path 126 and a site corresponding to the position of the cavity section 114 are on a same plane. Thereby, in the container 110, a thickness of the site corresponding to the position of the flow path 126 is the same as a thickness of the site corresponding to the position of the cavity section 114.

As illustrated in FIGS. 7A and 7B, the flow path 126 is provided in the position overlapping the hole portion 124 in plan view. Accordingly, the flow path 126 communicates with the hole portion 124. Further, as illustrated in FIG. 7A, the flow path 126 extends to the cavity section 114 (that is, the recessed part of the plate-shaped member 112 on the other side) from the position overlapping the hole portion 124, in plan view. The flow path 126 that is the recessed groove and the cavity section 114 that is the recessed part are connected in a continuous state. Accordingly, the flow path 126 communicates with the cavity section 114. As a result, the hole portion 124 and the cavity section 114 communicate with each other through the flow path 126. In the vapor chamber 5, an end portion on one side of the flow path 126 communicates with the hole portion 124, and an end portion on another side of the flow path 126 communicates with the cavity section 114. A depth of the flow path 126 is not specially limited and is arbitrarily selectable in accordance with the usage condition and the like, but, for example, a substantially same depth as the recessed part which is to be the cavity section 114 and is provided in the plate-shaped member 112 on the other side can be cited.

Further, as illustrated in FIG. 7C, a central portion that is a site between the site overlapping the hole portion 124 in plan view (that is, the end portion on one side) and the site communicating with the cavity section 114 in plan view (that is, the end portion on the other side) in the flow path 126 is located on a surface of the projecting portion 121 on one side.

As illustrated in FIGS. 6A to 6D and FIGS. 7A to 7D, a step portion 127 that is a step toward a direction of the projecting portion 121 on one side is provided in the position of the projecting portion 122 on the other side, in the front surface 125 of the plate-shaped member 112 on the other side. On the projecting portion 122 on the other side, a flat surface 128 that is not on a same plane as the front surface 125 of the plate-shaped member 112 on the other side, and is lower than the front surface 125 of the plate-shaped member 112 on the other side is provided, by the step portion 127. The step portion 127 and the flat surface 128 are provided along an extending direction of the flow path 126.

In the vapor chamber 5, the step portion 127 and the flat surface 128 are provided at both edge portions of the projecting portion 122 on the other side, that are along the extending direction of the flow path 126. The step portions 127 which are provided along the flow path 126 which is the recessed groove are provided one by one (two in total) with the flow path 126 between the step portions 127. That is, the step portions 127 are provided at both sides of the flow path 126 along the flow path 126. Further, the flat surface 128 extends to ends of the above described both edge portions. Accordingly, a sectional shape of the projecting portion 122 on the other side provided with the step portions 127 is in a protruded shape. The flow path 126 is provided in the above described projection portion in the protruded shape. Note that as illustrated in FIG. 6A and FIG. 7A, in the vapor chamber 5, the step portion 127 and the flat surface 128 are not only provided to the base portion from the tip end portion of the projecting portion 122 on the other side, but also extend to a vicinity of the cavity section 114 further in the direction of the cavity section 114 from the base portion of the projecting portion 122 on the other end. A height of the step portion 127 is not specially limited, but, for example, a dimension corresponding to the depth of the flow path 126 which is the recessed groove can be cited.

A production method of the cavity section 114 which is the recessed part of the plate-shaped member 112 on the other side and the flow path 126 which is the recessed groove communicating with the cavity section 114 is not specially limited, but etching, cutting and the like can be cited, for example. Further, a production method of the step portion 127 and the flat surface 128 is not specially limited, but etching, cutting and the like can be also cited similarly to the cavity section 114 and the flow path 126, for example. Accordingly, marks of etching, and marks of cutting are respectively recognized in the cavity section 114, the flow path 126, the step portion 127 and the flat surface 128.

A size of the flow path 126 is not specially limited, but in the vapor chamber 5, the flow path 126 has a width of 0.1 to 5 mm, a depth of 0.1 to 5 mm, and a length of 5 to 150 mm, for example. Further, a shape in plan view of the flow path 126 is not specially limited, but is linear in the vapor chamber 5.

As the material of the container 110, for example, a stainless steel, a copper, a copper alloy, an aluminum, an aluminum alloy, a tin, a tin alloy, a titanium, a titanium alloy, a nickel, a nickel alloy and the like are cited.

A thickness of the vapor chamber 5 is not specially limited, but, for example, 0.2 to 10 mm can be cited. Further, a thickness of the cavity section 114 is not specially limited, but, for example, 0.1 to 9.9 mm can be cited. Further, plate thicknesses of the plate-shaped member 111 on one side and the plate-shaped member 112 on the other side are not specially limited, but, for example, a plate thickness of 0.05 to 3 mm can be cited for the plate-shaped member 111 on one side, and a plate thickness of 0.15 to 9.95 mm can be cited for the plate-shaped member 112 on the other side.

As the working fluid that is sealed in the cavity section 114, any fluid is arbitrarily selectable in accordance with adaptability to the material of the container 110, and, for example, water, fluorocarbons, cyclopentane, ethylene glycol, a mixture of these substances and the like can be cited. The wick structure is not specially limited, but, for example, a sintered body of metal powder such as copper powder, metal mesh formed of a metal wire, a groove, unwoven fabric and the like can be cited.

Next, a method for injecting the working fluid into the cavity section 114 of the vapor chamber 5 according to the fifth embodiment will be described with use of the drawings. Before injecting the working fluid to the cavity section 114, the outer periphery (outer periphery of the cavity section 114) of the container 110 including the outer periphery of the projecting portions are welded (for example, laser welding, resistance welding and the like) and sealed in advance.

As illustrated in FIGS. 7A to 7D, the hole portion 124 communicates with the cavity section 114 through the flow path 126. Accordingly, a degassing device (not illustrated) is attached to the hole portion 124 first, degassing treatment of the inside of the cavity section 114 is performed through the flow path 126 from the hole portion 124, and the inside of the cavity section 114 is brought into a decompressed state. That is, the hole portion 124 functions as a degassing port of the cavity section 114. Further, the flow path 126 functions as a discharge path for gas that allows the gas in the cavity section 114 to flow into the hole portion 124 that is the degassing port from the cavity section 114. After the degassing treatment, the working fluid of a liquid phase (not illustrated) is injected into the cavity section 114 through the flow path 126 from the hole portion 124. That is, the hole portion 124 also functions as the injection port of the working fluid of the liquid phase. Further, the flow path 126 also functions as a supply path of the working fluid of the liquid phase that allows the working fluid of the liquid phase to flow into the cavity section 114 from the hole portion 124 that is the injection port. Note that here, the working fluid of the liquid phase is injected after the inside of the cavity section 114 is brought into the decompressed state, but instead of this, the degassing treatment of the inside of the cavity section 114 may be performed after the working fluid of the liquid phase is injected into the cavity section 114.

As described above, a sectional shape of the projecting portion 122 on the other side which is provided with the step portion 127 is a recessed shape, and the flow path 126 is located in the projection portion in the protruded shape. A sealed portion (not illustrated) is formed in the projecting portion by sealing the flow path 126 by crushing the central portion (site between the site corresponding to the hole portion 124 and the cavity section 114) of the flow path 126 onto the surface of the projecting portion 121 on one side by a caulking jig or the like after injecting the working fluid of the liquid phase into the cavity section 114 for which the degassing treatment is performed. By forming the sealed portion in the projecting portion, the working fluid is sealed into the decompressed cavity section 114. Further, it is possible to completely seal the sealed portion by welding the sealed portion of the projecting portion (for example, laser welding, resistance welding or the like). Accordingly, in the vapor chamber 5 which is sealed, the flow path 126 is sealed in the site between the site corresponding to the hole portion 124 and the cavity section 114. Further in the sealed vapor chamber 5, the flow path 126 is in the mode left to the cavity section 114 from the position of the hole portion 124 (position of the projecting portion).

In the vapor chamber 5 according to the first embodiment, the projecting portion 121 on one side can have a space where the hole portion 124 that is the degassing port and the injection port for the working fluid of the liquid phase is provided, and the projecting portion 122 on the other side can have a same space as the projecting portion 121 on one side, so that it is possible to reduce projecting amounts of the projecting portion 121 on one side and the projecting portion 122 on the other side. Accordingly, it is possible to prevent reduction in area of the cavity section 114 where the working fluid exhibits heat transportation characteristics, while reducing the space of the outer periphery of the cavity section 114. Thereby, even when the installation space of the vapor chamber 5 is narrow and small, it is possible to ensure the area of the cavity section 114, and exhibit excellent heat radiation efficiency.

It is not necessary to prepare a separate member from the container 110 such as a nozzle in order to degas the cavity section 114 and inject the working fluid into the cavity section 114 in the vapor chamber 5, so that it is possible to reduce the number of components. Further, in manufacturing, a step of attaching a separate member from the container 110 such as a nozzle to the container 110 is not necessary in the vapor chamber 5, so that excellent productivity is provided.

Further, in the vapor chamber 5, the flow path 126 is provided in the projection portion with the sectional shape of the projecting portion 122 on the other side, which is a protruded shape, so that sealing of the flow path 126 by crushing is easy. Further, in the container 110 of the vapor chamber 5, a thickness of the site corresponding to the position of the flow path 126 and a thickness of the site corresponding to the position of the cavity section 114 are the same, so that increase in the thickness of the container 110 in the site of the flow path 126 can be avoided. Accordingly, it is possible to omit the step of crushing the entire flow path 126, in keeping the thinness of the container 110 in the vapor chamber 5.

Next, a vapor chamber according to a sixth embodiment of the present disclosure will be described with use of the drawings. Note that the same components as the vapor chamber according to the fifth embodiment will be described with use of the same reference signs.

Figure 8A:
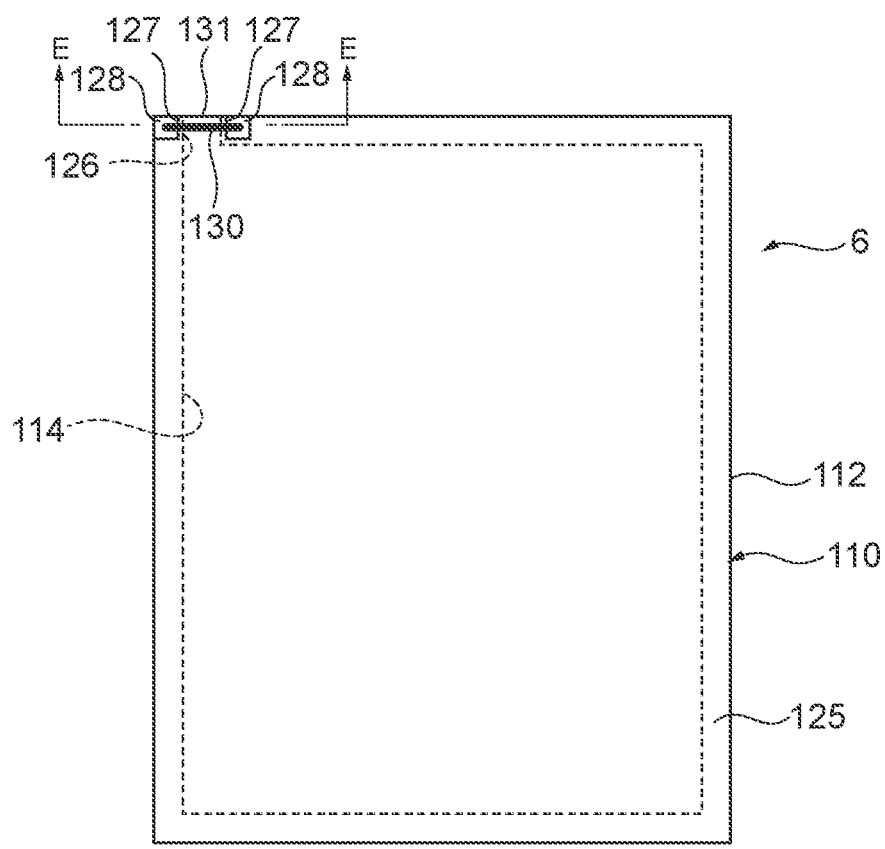
FIG. 8A is a plan view of a vapor chamber according to a sixth embodiment of the present disclosure after completely sealing.
Figure 8B:
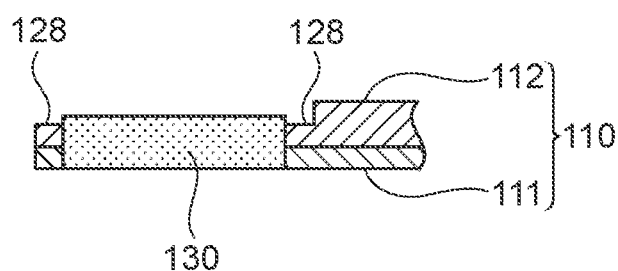
FIG. 8B is an explanatory view of a section along line (E)-(E) in FIG. 8A.

In the vapor chamber according to the fifth embodiment, the sealed portion is formed in the central portion of the flow path, and the sealed portion is completely sealed by welding the sealed portion, but as illustrated in FIGS. 8A and 8B, in a vapor chamber 6 according to a sixth embodiment, after completely sealing the sealed portion formed in the central portion of the flow path 126 by welding, a projecting portion on one side and a projecting portion on another side that are stacked are cut, on a tip end portion side from the sealed portion.

In the vapor chamber 6, in the central portion of the flow path 126, a site between a base portion of the projecting portion on the other side and the cavity section 114, that is, a site of an edge portion of the cavity section 114 that is not the projecting portion on the other side is crushed onto a surface of the plate-shaped member 111 on one side, and the sealed portion is formed in the flow path 126. Further, a welded portion 130 is formed by welding the above described sealed portion (for example, laser welding, resistance welding or the like). Outside from the sealed portion where the welded portion 130 is formed, that is, on a tip end portion side of the projecting portion, the projecting portion on one side and the projecting portion on the other side which are stacked are cut and a cut portion 131 of the stacked projecting portions is formed. Accordingly, in the sealed vapor chamber 6, the flow path 126 which is sealed by the welded portion 130 formed on the edge portion of the container 110 is in a mode left to the position of the cavity section 114 from a position of the cut portion 131. In correspondence with the mode, the step portions 127 and the flat surfaces 128 are in a mode left to a position in a vicinity of the cavity section 114 from the position of the cut portion 131.

As illustrated in FIG. 8A, in the vapor chamber 6, the projecting portion on one side and the projecting portion on the other side that are stacked are both cut at base portions of the projecting portion on one side and the projecting portion on the other side. Accordingly, a section of the cut portion 131 does not project from an outer periphery of the container 110.

The stacked projecting portions are cut, whereby it is possible to reduce the projecting amount of the stacked projecting portions more, and further in the vapor chamber 6, the stacked projecting portions are completely removed by the stacked projecting portions being cut at the base portions of the stacked projecting portions, so that it is possible to ensure the area of the cavity section 114 more sufficiently while reducing the space of the outer periphery of the cavity section 114 more.

Next, a vapor chamber according to a seventh embodiment of the present disclosure will be described with use of the drawings. Note that the same components as the components of the vapor chambers according to the fifth and sixth embodiments will be described by using the same reference signs.

Figure 9:
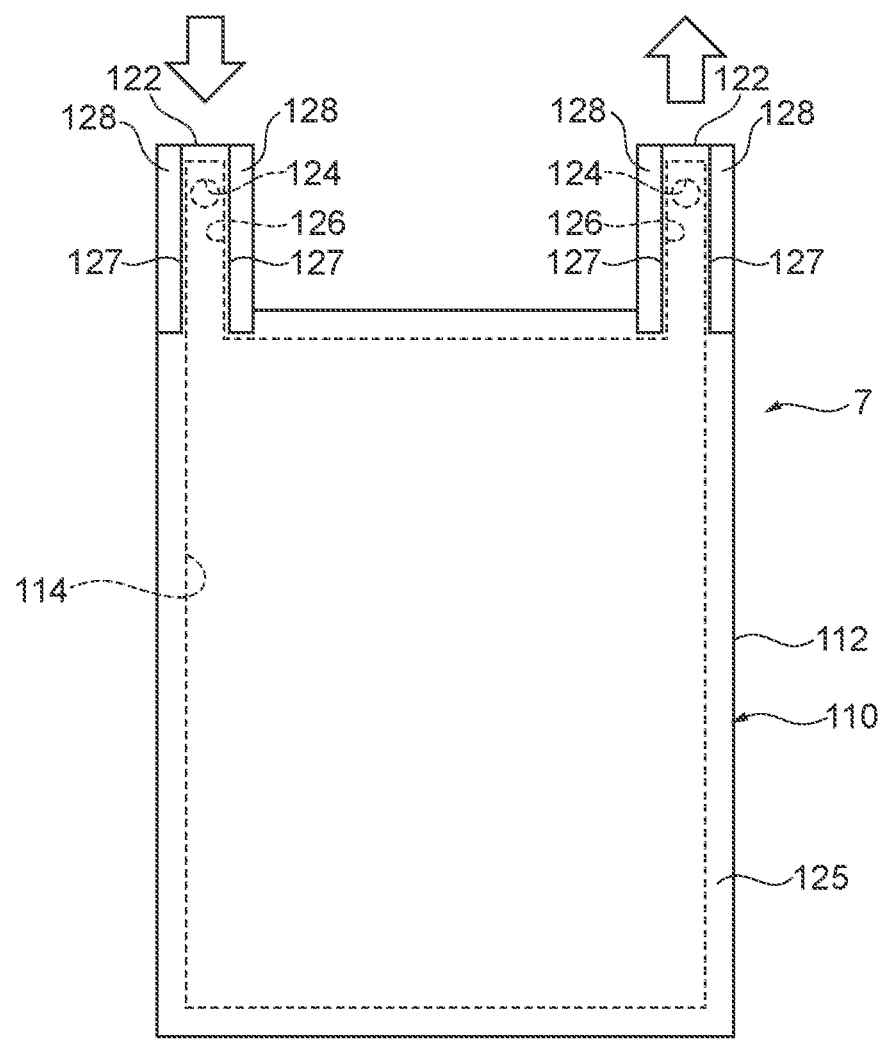
FIG. 9 is a plan view of a vapor chamber according to a seventh embodiment of the present disclosure before sealing.

In the vapor chamber according to the above described fifth embodiment, one set of stacked projecting portions is provided, but instead of this, as illustrated in FIG. 9, in a vapor chamber 7 according to the seventh embodiment, a plurality of sets of stacked projecting portions (two in FIG. 9) are provided. That is, in the vapor chamber 7, a plurality (two in FIG. 9) of projecting portions on one side and a plurality (two in FIG. 9) of projecting portions 122 on another side are provided respectively. Further, in correspondence with the fact that the plate-shaped member on one side and the plate-shaped member 112 on the other side are stacked in mutually overlapping positions in plan view, two of the projecting portions on one side and two of the projecting portions 122 on the other side are respectively stacked in mutually overlapping positions in plan view, and two sets of the stacked projecting portions (first stacked projecting portions and second stacked projecting portions) are formed.

The positions of the stacked projecting portions are not specially limited, but in the vapor chamber 7, the one set of stacked projecting portions are provided at each of end portions facing each other of the container 110.

In the vapor chamber 7, the inside of the cavity section 114 is brought into a decompressed state by injecting a working fluid of a liquid phase into the cavity section 114 from the first stacked projecting portions (the stacked projecting portions at a left side in FIG. 9), and by performing degassing treatment of the inside of the cavity section 114 from the second stacked projecting portions (stacked projecting portions at a right side in FIG. 9), of the two sets of stacked projecting portions. That is, in the vapor chamber 7, the stacked projecting portions for injecting the working fluid of a liquid phase, and the stacked projecting portions for degassing the cavity section 114 are provided.

In the vapor chamber 7 according to the seventh embodiment, it is possible to reduce the projecting amounts of the stacked projecting portions similarly to the vapor chamber according to the fifth embodiment with the one set of stacked projecting portions, so that it is possible to prevent reduction in area of the cavity section 114 where the working fluid exhibits heat transportation characteristics while reducing the space of the outer periphery of the cavity section 114.

Next, a vapor chamber according to an eighth embodiment of the present disclosure will be described with use of the drawings. Note that the same components as the components of the vapor chambers according to the fifth to seventh embodiments will be described with use of the same reference signs.

In the vapor chamber according to the eighth embodiment, the recessed part is not provided in the central portion of a plate-shaped member on one side, but the plate-shaped member on one side is in a planar shape, but instead of this, as illustrated in FIG. 10A, in the vapor chamber 8 according to the eighth embodiment, the recessed part 144 is provided in the central portion of not only the plate-shaped member 112 on the other side, but also of the plate-shaped member 111 on one side. The recessed part 144 of the plate-shaped member 111 on one side is provided in a position overlapping a recessed part 114' of the plate-shaped member 112 on the other side in plan view.

Accordingly, as illustrated in FIG. 10B, the recessed part 114' of the plate-shaped member 112 on the other side and the recessed part 144 of the plate-shaped member 111 on one side form the cavity section 114 of the container 110. That is, a hollow section of the container 110 that is formed by an inner surface of the recessed part 114' of the plate-shaped member 112 on the other side and an inner surface of the recessed part 144 of the plate-shaped member 111 on one side is the cavity section 114.

In the vapor chamber 8, it is possible to reduce the projecting amounts of the stacked projecting portions, so that it is possible to prevent reduction in area of the cavity section 114 where a working fluid exhibits heat transportation characteristics, while reducing the space of the outer periphery of the cavity section 114.

Next, other embodiments of the vapor chamber of the present disclosure be described. In the vapor chamber according to the fifth embodiment, the central portion of the flow path is crushed onto the surface of the projecting portion on one side to form the sealed portion in the flow path, and the sealed portion is welded, but instead of this, the stacked projecting portions may be cut, on a tip end portion side from the welded sealed portion. Further, in the vapor chamber according to the seventh embodiment, the tip end portions of the stacked projecting portions may be cut, on the tip end portion side from the sealed portion of the projecting portions which is welded. Further, in the vapor chamber according to the fifth embodiment, the step portion and the flat surface extend to the vicinity of the cavity section from the tip end portion of the projecting portion on the other side, but the step portion and the flat surface can be provided in a site that seals the flow path, and instead of this, the step portion and the flat surface may be provided in only a site from the tip end portion to the base portion of the projecting portion on the other side, in only a part of a site from the tip end portion of the projecting portion on the other side to the base portion, or in only a site between the base portion of the projecting portion on the other side and the cavity section.

The vapor chamber of the present disclosure can prevent reduction in area of the cavity section while reducing the space of the outer periphery of the cavity section in which the working fluid is sealed, and therefore has high usage value in the field in which the vapor chamber is installed in a narrow and small space, and is required to have excellent heat radiation efficiency.

What is claimed is:

1. A vapor chamber comprising:
a container in which a cavity section is formed by stacked plate-shaped members;
a working fluid that is sealed in the cavity section; and
a wick structure accommodated in the cavity section,
wherein a first plate-shaped member on a first side of the container, forming a first outermost layer of the container, has at least one projecting portion having a first hole portion,
wherein a second plate-shaped member on a second side of the container, forming a second outermost layer of the container opposite of the first outermost layer, has at least one projecting portion that is stacked on the projecting portion of the first plate-shaped member, and includes a flow path that allows the first hole portion and the cavity section to communicate with each other,
wherein an outer periphery of the cavity section is sealed, and
wherein a third plate-shaped member forming a middle layer is stacked between the first plate-shaped member on the first side forming the first outermost layer and the second plate-shaped member on the second side forming the second outermost layer, wherein the third plate-shaped member has at least one projecting portion that overlaps with the projecting portion of the first plate-shaped member and the projecting portion of the second plate-shaped member, wherein the third plate-shaped member includes a second hole portion communicating with the first hole portion and the flow path, and the third plate-shaped member further includes a frame portion forming an inner side surface of the cavity section.

2. The vapor chamber according to claim 1, wherein a number of the stacked plate-shaped members is at least three.

3. The vapor chamber according to claim 1, wherein the flow path is formed by sheet metal processing.

4. The vapor chamber according to claim 1, wherein the first hole portion and the second hole portion are circular in plan view, and have diameters of 0.1 mm to 5 mm.

5. The vapor chamber according to claim 1, wherein the flow path has a width of 0.1 mm to 5 mm, a height of 0.1 mm to 5 mm, and a length of 5 mm to 150 mm.

6. The vapor chamber according to claim 1, wherein a material of the container is at least one kind of metal selected from a group comprising a stainless steel, a copper, a copper alloy, an aluminum, an aluminum alloy, a tin, a tin alloy, a titanium, a titanium alloy, a nickel and a nickel alloy.

7. A vapor chamber comprising:
a container in which a cavity section is formed by stacked plate-shaped members;
a working fluid that is sealed in the cavity section;
a wick structure accommodated in the cavity section,
wherein a first plate-shaped member on a first side of the container, forming a first outermost layer of the container, has at least one projecting portion having a hole portion, and a second plate-shaped member on a second side of the container, forming a second outermost layer of the container, has at least one projecting portion on the second side that is stacked on the projecting portion of the first plate-shaped member, and the second plate shaped member includes a flow path that allows the hole portion and the cavity section to communicate with each other,
wherein an outer periphery of the cavity section is sealed; and
a sealed portion of the flow path overlaps the cavity section from a position overlapping the hole portion.

8. The vapor chamber according to claim 7, wherein the projecting portion of the first plate-shaped member and the projecting portion on the second plate-shaped member which are stacked are cut to form a cut portion outside of the sealed portion.

9. The vapor chamber according to claim 8, wherein the cut portion does not project from the outer periphery of the container.

10. A vapor chamber, comprising:
a container in which a cavity section is formed by a first plate-shaped member on a first side of the container and a second plate-shaped member on a second side of the container that is stacked on the first plate-shaped member on the first side of the container;
a working fluid that is sealed in the cavity section;
a wick structure accommodated in the cavity section, wherein
the first plate-shaped member has at least a first projecting portion having a hole portion, wherein
the second plate-shaped member has at least a second projecting portion that is stacked on the projecting portion of the first plate-shaped member, and includes a flow path that allows the hole portion and the cavity section to communicate with each other, wherein
a recessed part is formed on a first surface of the second plate-shaped member, the surface facing the first plate-shaped member, wherein the recessed part of the second plate-shaped member forms at least a part of the cavity section, wherein
the flow path is a recessed groove that is formed on the first surface in the projecting portion of the second plate-shaped member, the flow path facing the projecting portion of the first plate-shaped member, a step portion that is a step in a direction of the projecting portion of the second plate-shaped member is formed along the flow path, on a second surface of the second plate-shaped member opposite the first surface, and wherein an outer periphery of the cavity section is sealed, and a sealed portion of the flow path, at a cavity section side from the hole portion.

11. The vapor chamber according to claim 10, wherein the step portion is formed on each of both edge portions of the projecting portion of the second plate-shaped member on opposite sides of the flow path.

12. The vapor chamber according to claim 10, wherein the projecting portion of the first plate-shaped member and the projecting portion of the second plate-shaped portion are stacked and cut to form a cut portion outside of the sealed portion.

13. The vapor chamber according to claim 12, wherein the cut portion does not project from the outer periphery of the container.

14. The vapor chamber according to claim 10, wherein the flow path is formed by etching or cutting.

15. The vapor chamber according to claim 10, wherein the step portion is formed by etching or cutting.

16. The vapor chamber according to claim 10, wherein the hole portion is circular in plan view, and has a diameter of 0.1 mm to 5 mm.

17. The vapor chamber according to claim 10, wherein the flow path has a width of 0.1 mm to 5 mm, a depth of 0.1 mm to 5 mm, and a length of 5 mm to 150 mm.

18. The vapor chamber according to claim 10, wherein a material of the container is at least one kind of metal selected from a group comprising a stainless steel, a copper, a copper alloy, an aluminum, an aluminum alloy, a tin, a tin alloy, a titanium, a titanium alloy, a nickel and a nickel alloy.

* * * * *